United States Patent
Maeng et al.

(10) Patent No.: US 8,859,314 B2
(45) Date of Patent: Oct. 14, 2014

(54) METHOD OF MANUFACTURING SEMICONDUCTOR LIGHT EMITTING DEVICE

(75) Inventors: Jong Sun Maeng, Gwangju (KR); Ki Ho Park, Hwaseong (KR); Bum Joon Kim, Seoul (KR); Hyun Seok Ryu, Suwon (KR); Jung Hyun Lee, Ansan (KR); Boung Kyun Kim, Suwon (KR); Ki Sung Kim, Suwon (KR); Suk Ho Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/523,571

(22) Filed: Jun. 14, 2012

(65) Prior Publication Data

US 2012/0322188 A1 Dec. 20, 2012

(30) Foreign Application Priority Data

Jun. 15, 2011 (KR) .................. 10-2011-0058004

(51) Int. Cl.
*H01L 33/32* (2010.01)
*H01L 33/00* (2010.01)

(52) U.S. Cl.
CPC .......... *H01L 33/007* (2013.01); *H01L 33/0079* (2013.01)
USPC .................................... 438/46; 257/E33.023

(58) Field of Classification Search
USPC ............ 438/5, 46, 22, 29, 963; 257/E33.023, 257/E33.025, E33.028, E33.033; 156/345.1, 345.27, 345.29, 345.26, 156/345.33, 345.43, 345.44; 216/67, 68; 204/298.31, 298.33
See application file for complete search history.

(56) References Cited

U.S. PATENT DOCUMENTS

| | | | |
|---|---|---|---|
| 5,217,560 A * | 6/1993 | Kurono et al. | 156/345.43 |
| 7,795,054 B2 * | 9/2010 | Cho et al. | 438/29 |
| 2008/0318426 A1 | 12/2008 | Kim et al. | |
| 2010/0025228 A1 | 2/2010 | Tauzin et al. | |
| 2011/0171758 A1 * | 7/2011 | Su et al. | 438/5 |
| 2012/0097184 A1 | 4/2012 | Park et al. | |

FOREIGN PATENT DOCUMENTS

| | | |
|---|---|---|
| JP | 2002261081 A | 9/2002 |
| JP | 2010109151 A | 5/2010 |
| KR | 1020030026475 A | 4/2003 |
| KR | 1020080113479 A | 12/2008 |
| KR | 1020120040791 A | 4/2012 |
| WO | 2009/039212 A1 | 3/2009 |

* cited by examiner

*Primary Examiner* — Alexander Ghyka
(74) *Attorney, Agent, or Firm* — Sughrue Mion, PLLC (57) ABSTRACT

There is provided a method of manufacturing a semiconductor light emitting device, the method including: sequentially growing a first conductivity type semiconductor layer, an active layer, and a second conductivity type semiconductor layer on a semiconductor growth substrate to form a light emitting part; forming a support part on the second conductivity type semiconductor layer to be coupled to the light emitting part; separating the semiconductor growth substrate from the light emitting part; and applying an etching gas to the semiconductor growth substrate to remove a residue of the first conductivity type semiconductor layer from a surface of the semiconductor growth substrate.

14 Claims, 7 Drawing Sheets

METHOD OF MANUFACTURING SEMICONDUCTOR LIGHT EMITTING DEVICE

CROSS-REFERENCE TO RELATED APPLICATIONS

This application claims the priority of Korean Patent Application No. 10-2011-0058004 filed on Jun. 15, 2011, in the Korean Intellectual Property Office, the disclosure of which is incorporated herein by reference.

BACKGROUND OF THE INVENTION

1. Field of the Invention

The present invention relates to a method of manufacturing a semiconductor light emitting device.

2. Description of the Related Art

A semiconductor light emitting device such as a light emitting diode (LED) is manufactured by depositing semiconductor layers having different electrical and optical characteristics on a wafer so as to have a laminated structure, and performing etching and patterning processes thereupon.

These semiconductor layers are generally formed by depositing an epitaxial thin film on a wafer, a growth substrate provided within a chemical vapor deposition apparatus. A vertical type nitride semiconductor light emitting device is manufactured by separating laminated semiconductor layers formed by deposition, as described above, from the growth substrate.

The semiconductor growth substrate from which the semiconductor layer has been separated may be provided to a separate apparatus, subjected to a recycling process, and then reused as a substrate for growing semiconductor layers. In this case, since a portion of a semiconductor layer may remain on a surface of the growth substrate, a process for removing the portion of the semiconductor layer should be performed.

In the case of a generally used method of recycling a wafer through physical polishing, a surface of the wafer may also be partially removed, together with a residue of the semiconductor layer, such that an upper surface of the wafer may be damaged, a thickness of the wafer may be reduced, and additional residue and by-products may be generated on the wafer.

In addition, in the case of a method of chemically removing a residue of the semiconductor layer through immersion, since a cleaning process for removing a chemical immersion solution should be additionally performed, a process may become complicated and processing times may be increased. Further, the use of a toxic chemical solution may cause an environmental pollution problem. Furthermore, recycling costs such as costs required for an additional treatment facility and the like, may be increased as compared to costs required for manufacturing new wafers.

SUMMARY OF THE INVENTION

An aspect of the present invention provides a method of manufacturing a semiconductor light emitting device on a surface of a wafer, a semiconductor growth substrate, while allowing the surface of the wafer not to be damaged in removing a portion of a semiconductor layer remaining thereon.

Another aspect of the present invention provides a method of manufacturing a semiconductor light emitting device capable of simultaneously processing a large number of the wafers.

According to an aspect of the present invention, there is provided a method of manufacturing a semiconductor light emitting device, the method including: sequentially growing a first conductivity type semiconductor layer, an active layer, and a second conductivity type semiconductor layer on a semiconductor growth substrate to form a light emitting part; forming a support part on the second conductivity type semiconductor layer to be coupled to the light emitting part; separating the semiconductor growth substrate from the light emitting part; and applying an etching gas to the semiconductor growth substrate to remove a residue of the first conductivity type semiconductor layer from a surface of the semiconductor growth substrate.

The method may further include inspecting whether or not the residue remains on the surface of the semiconductor growth substrate and whether or not a thickness of the semiconductor growth substrate is decreased, after the applying of the etching gas.

The first and second conductivity type semiconductor layers may include a nitride-based semiconductor layer.

The nitride-based semiconductor layer may include GaN, AlGaN, InGaN, or AlInGaN.

The support part may be formed of a conductive material.

The applying of the etching gas may include disposing the semiconductor growth substrate having the residue of the first conductivity type semiconductor layer remaining on the surface thereof in a reaction chamber; heating and pressurizing an interior of the reaction chamber so that the semiconductor growth substrate is exposed to predetermined temperature and pressure conditions; and releasing the etching gas into the reaction chamber through a gas supply part to remove the residue of the first conductivity type semiconductor layer from the surface of the semiconductor growth substrate.

The etching gas may include an HCl gas or a $Cl_2$ gas.

The etching gas may be further mixed with an auxiliary gas.

The auxiliary gas may include a hydrogen ($H_2$) gas, a nitrogen ($N_2$) gas, or an argon (Ar) gas.

The etching gas may be plasmarized and then released.

The etching gas may be released into respective regions partitioned in a height direction in the interior of the reaction chamber through a plurality of gas supply parts having different heights.

The gas supply part may be provided on an upper surface of the reaction chamber and release the etching gas toward the semiconductor growth substrate provided thereunder.

The gas supply part may be provided along a circumference of a side of the reaction chamber and inverse-radially release the etching gas toward a central part of the reaction chamber.

The reaction chamber may be configured to have a single chemical vapor deposition apparatus and have the semiconductor growth substrate seated on an upper surface of a susceptor provided therein.

The reaction chamber may be configured to have a furnace chemical vapor deposition apparatus and have the semiconductor growth substrate loaded in a boat provided therein.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

A method of manufacturing a semiconductor light emitting device according to embodiments of the present invention will now be described with reference to the accompanying drawings. The exemplary embodiments of the present invention may be modified in many different forms and the scope of the invention should not be seen as being limited to the embodiments set forth herein. Rather, these embodiments are provided so that this disclosure will be thorough and complete, and will fully convey the concept of the invention to those skilled in the art.

In the drawings, the shapes and dimensions of components may be exaggerated for clarity, and the same reference numerals will be used throughout to designate the same or like components.

A chemical vapor deposition apparatus for performing a method of manufacturing a semiconductor light emitting device according to an embodiment of the present invention will be described with reference to FIGS. 1 through 5.

Figure 1:
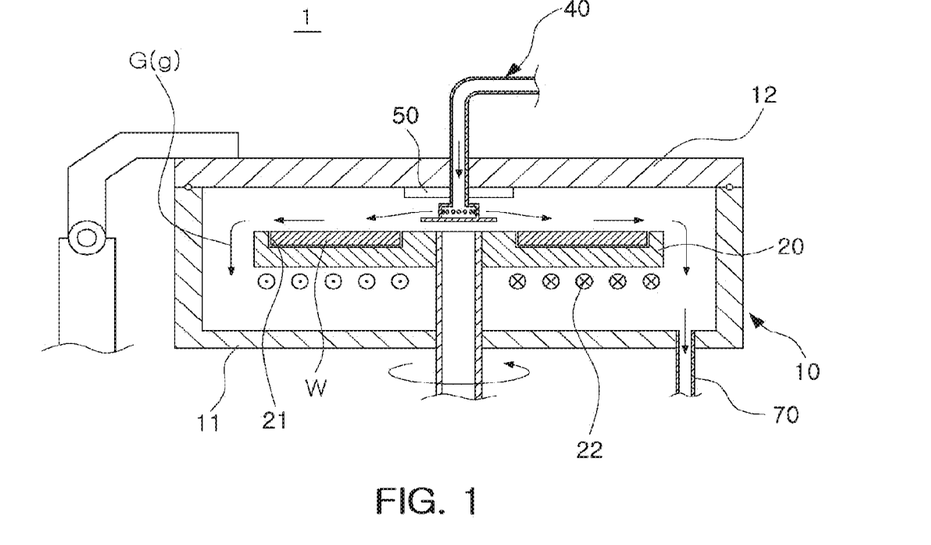
FIG. 1 is a view schematically showing a chemical vapor deposition apparatus performing a method of manufacturing a semiconductor light emitting device according to an embodiment of the present invention.
Figure 2:
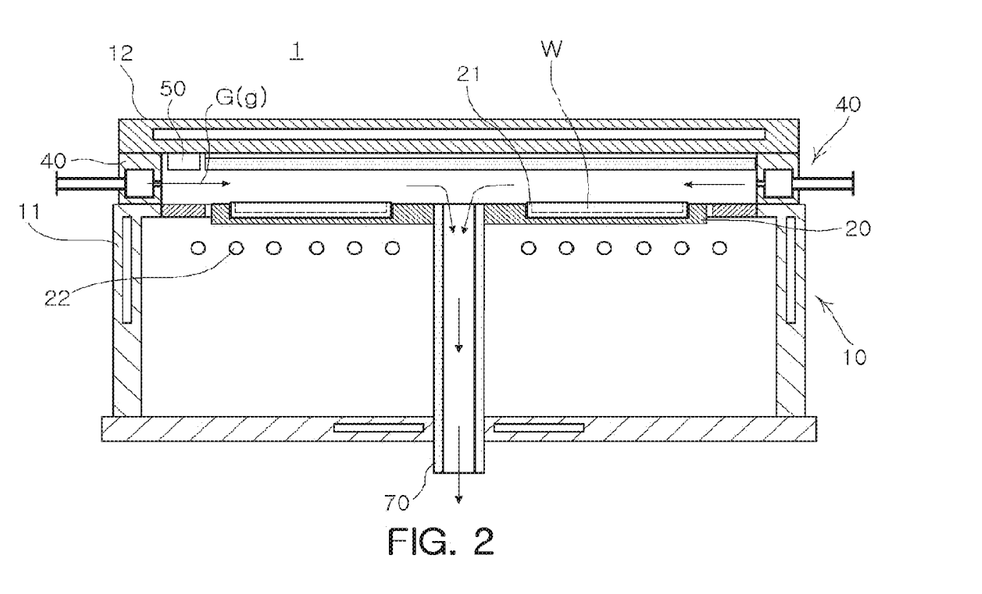
FIG. 2 is a view schematically showing a modified example of the chemical vapor deposition apparatus of FIG. 1.
Figure 3:
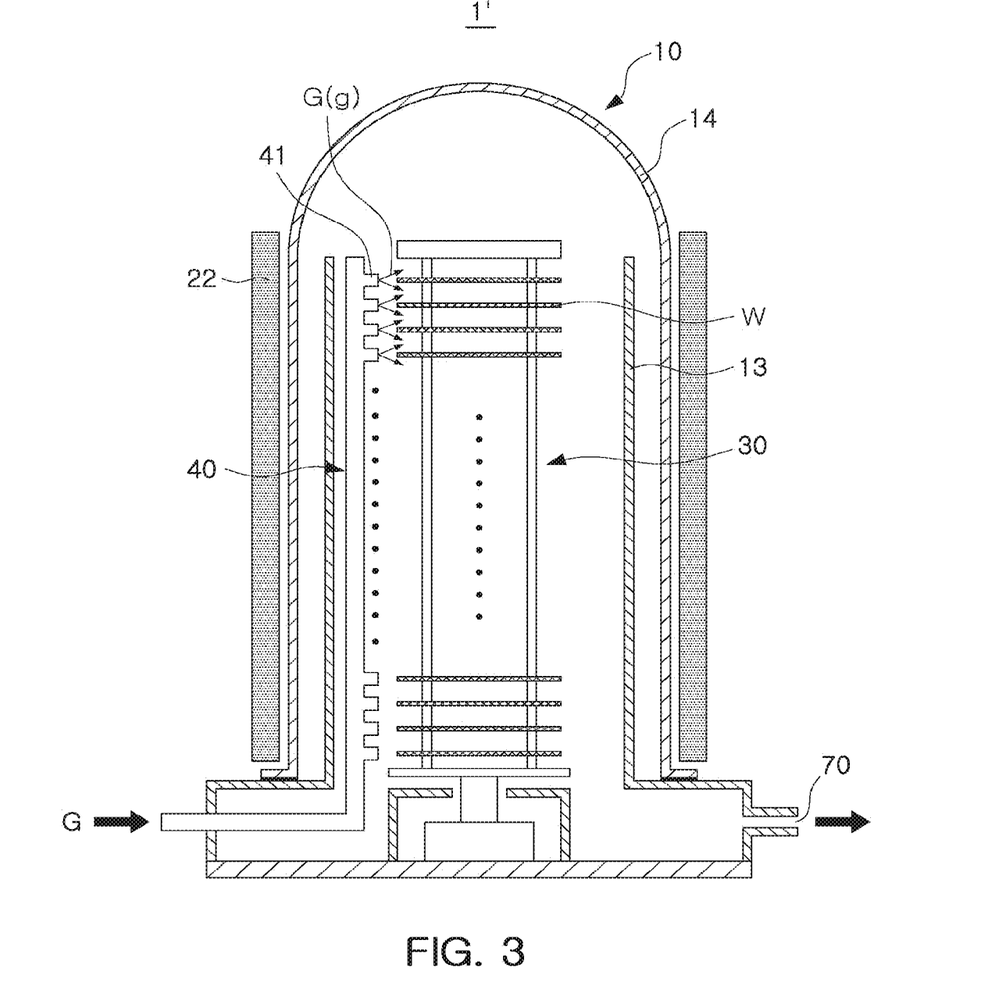
FIG. 3 is a view schematically showing another example of a chemical vapor deposition apparatus performing the method of manufacturing a semiconductor light emitting device according to the embodiment of the present invention.
Figure 4A:
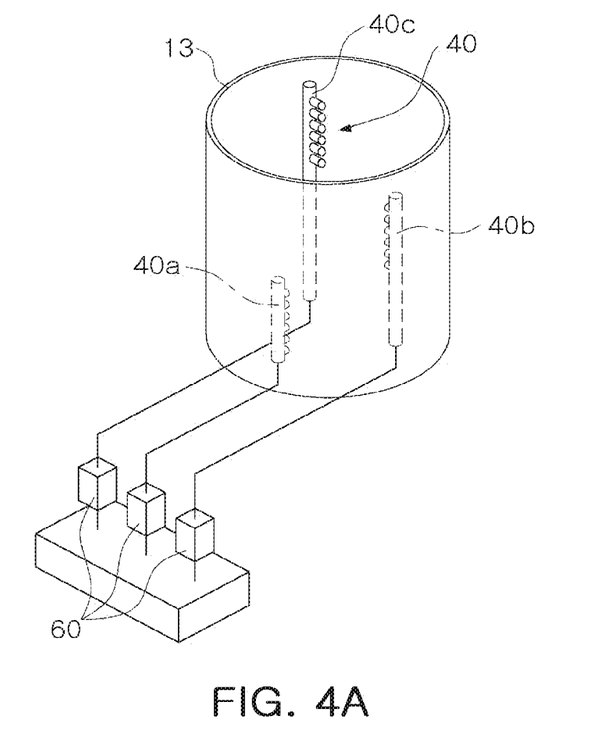
FIG. 4A is a view schematically showing a structure in which gas supply parts are disposed to correspond to different regions of a boat in a vertical direction of the chemical vapor deposition apparatus of FIG. 3.
Figure 4B:
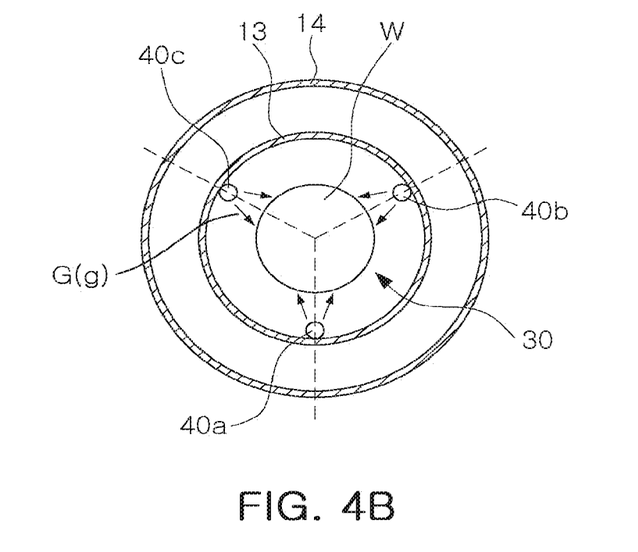
FIG. 4B is a horizontal cross-sectional view of FIG. 4A.
Figure 5:
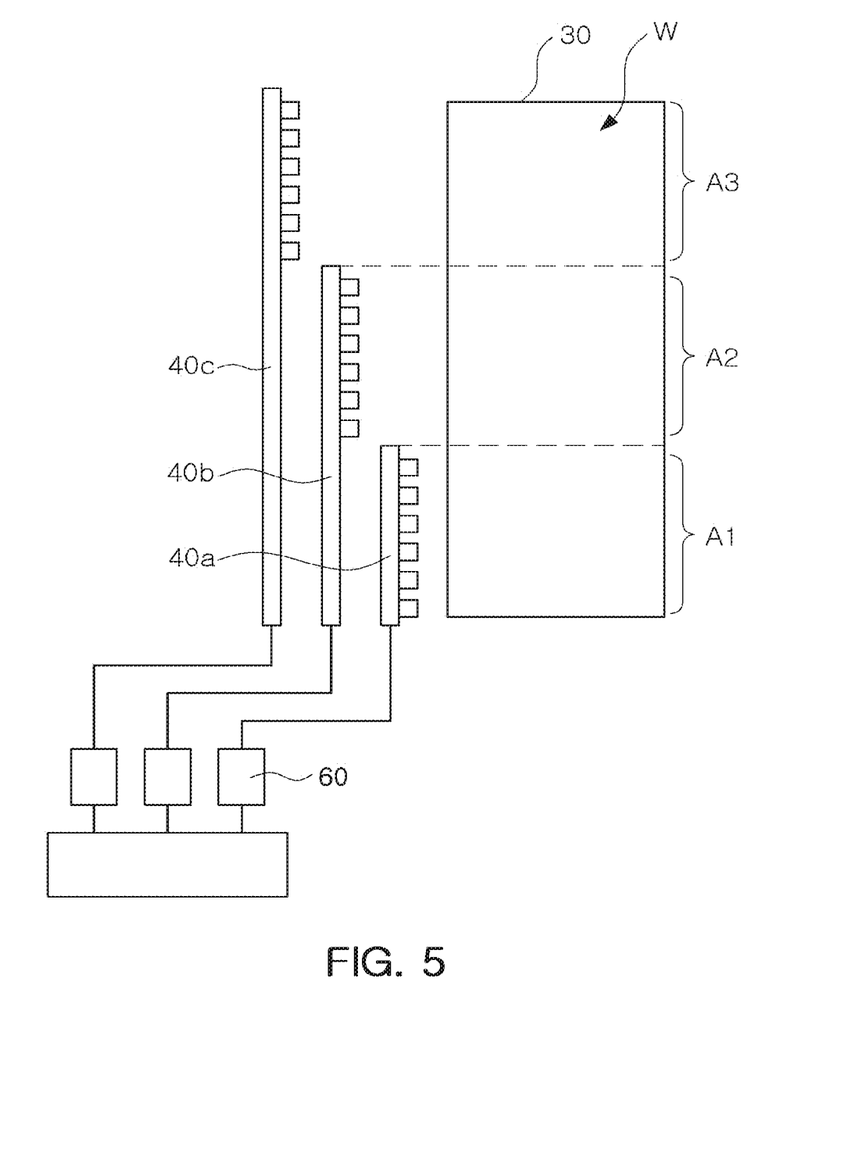
FIG. 5 is a vertical cross-sectional view of FIG. 4A.

FIG. 1 is a view schematically showing a chemical vapor deposition apparatus performing a method of manufacturing a semiconductor light emitting device according to an embodiment of the present invention, FIG. 2 is a view schematically showing a modified example of the chemical vapor deposition apparatus of FIG. 1, and FIG. 3 is a view schematically showing another example of a chemical vapor deposition apparatus performing the method of manufacturing a semiconductor light emitting device according to the embodiment of the present invention. FIG. 4A is a view schematically showing a structure in which gas supply parts are disposed to correspond to different regions of a boat in a vertical direction of the chemical vapor deposition apparatus of FIG. 3, FIG. 4B is a horizontal cross-sectional view of FIG. 4A, and FIG. 5 is a vertical cross-sectional view of FIG. 4A.

As shown in FIGS. 1 and 2, a chemical vapor deposition apparatus 1 may be a horizontal type single chemical vapor deposition apparatus, and include a reaction chamber 10, a susceptor 20, and a gas supply part 40.

The reaction chamber 10 may include a chamber body 11 and a chamber cover 12 maintaining airtightness by covering the chamber body 11, and the chamber cover 12 may be provided to be opened and closed in the chamber body 11.

The susceptor 20 may be provided in the chamber body 11 so as to be fixable or rotatable, include a pocket 21 depressed downwardly from an upper surface thereof to allow a semiconductor growth substrate, that is, a wafer W, to be seated and received therein, and include a heating unit 22 provided on a lower surface thereof to heat an interior of the reaction chamber 10 including the susceptor 20.

The gas supply part 40 may be provided in an upper surface of the reaction chamber 10, that is, in the chamber cover 12, to supply a reaction gas G toward the susceptor 20 provided thereunder, as shown in FIG. 1. In addition, the gas supply part 40 may be provided at a side of the reaction chamber 10, that is, along a circumference of an upper end portion of the chamber body 11 to inverse-radially supply the reaction gas G toward a central portion of the susceptor 20, as shown in FIG. 2.

Meanwhile, as shown in FIG. 3, a chemical vapor deposition apparatus 1' may be a vertical type furnace chemical vapor deposition apparatus, and include a reaction chamber 10, a boat 30, and a gas supply part 40.

The reaction chamber 10 may have a double-pipe structure in which it includes an internal chamber 13 and an external chamber 14 maintaining airtightness by covering the internal chamber 13. An interior of the reaction chamber 10 may be heated through a heating unit 22 provided along a circumference of the reaction chamber 10.

The boat 30 may include a plurality of wafers W loaded and mounted therein at predetermined intervals. The boat 30 including the wafers W loaded therein may be disposed in the reaction chamber 10 or be withdrawn to the outside. Therefore, hundreds of wafers W may be loaded in the boat 30 at predetermined intervals, whereby semiconductor light emitting devices may be mass-produced.

At least one gas supply part 40 may be disposed between the internal chamber 13 and the boat 30 and vertically extended in a height direction along the plurality of loaded wafers W to supply a reaction gas G to the reaction chamber 10.

A plurality of gas supply parts 40 may be disposed to be spaced apart from each other along a circumference of the boat 30 so that semiconductor layers may be uniformly grown throughout the plurality of wafers W loaded in the height direction, as shown in FIG. 4A. Particularly, the plurality of gas supply parts may have different heights, corresponding to heights of respective regions A1, A2, and A3 of the interior of the reaction chamber partitioned in the height direction in which the wafers W are loaded in the boat 30, as shown in FIGS. 4A and 5.

Specifically, as shown in FIG. 5, in the case in which the boat 30 is partitioned into three regions, that is, a lower region A1, a central region A2, and an upper region A3, the gas supply part 40 may include a first gas supply part 40a supplying the reaction gas G to the lower region A1 of the boat 30, a second gas supply part 40b supplying the reaction gas G to the central region A2 thereof, and a third gas supply part 40c supplying the reaction gas G to the upper region A3 thereof. Here, the first gas supply part 40a may have a height corresponding to that of the lower region A1, the second gas supply part 40b may have a height corresponding to that of the central region A2, and the third gas supply part 40c may have a height corresponding to that of the upper region A3.

In addition, the gas supply parts 40 may be individually connected to flowmeters 60 controlling a supply amount of the reaction gas G to thereby independently control the supply amount of the reaction gas G. That is, the amount of the reaction gas G supplied to each of the first to third gas supply parts 40a, 40b and 40c may be individually controlled through the flow meters 60 respectively connected to the first to third gas supply parts, 40a, 40b, and 40c.

Therefore, the gas supply parts 40a, 40b, and 40c, disposed corresponding to the respective regions A1, A2, and A3 of the boat 30, may appropriately control the amount of the reaction gas G supplied to the respective regions through the flowmeters 60 provided for the individual gas supply parts to thereby prevent a difference in uniformity of the semiconductor layer in each region from being generated, without setting a temperature gradient for the height direction region of the boat 30.

A method of manufacturing a semiconductor light emitting device according to an embodiment of the present invention will be described with reference to FIGS. 6A through 7 and the chemical vapor deposition apparatus shown in FIGS. 1 through 5.

Figure 6A:
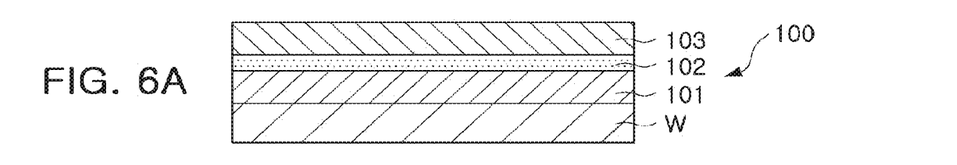
FIGS. 6A through 6C are views schematically showing a method of manufacturing a semiconductor light emitting device according to an embodiment of the present invention.
Figure 6B:
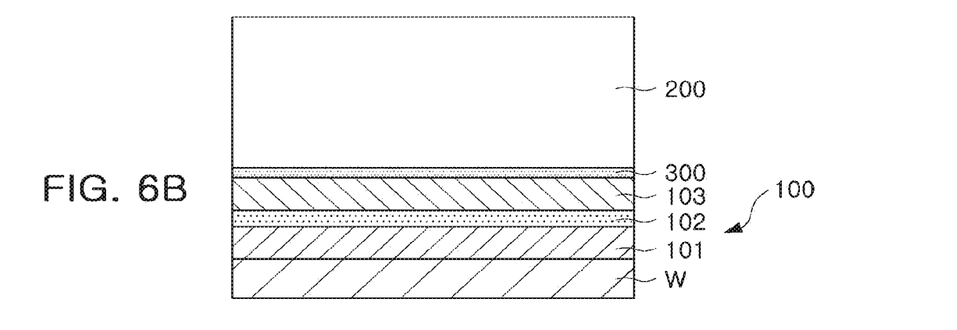
Figure 6C:
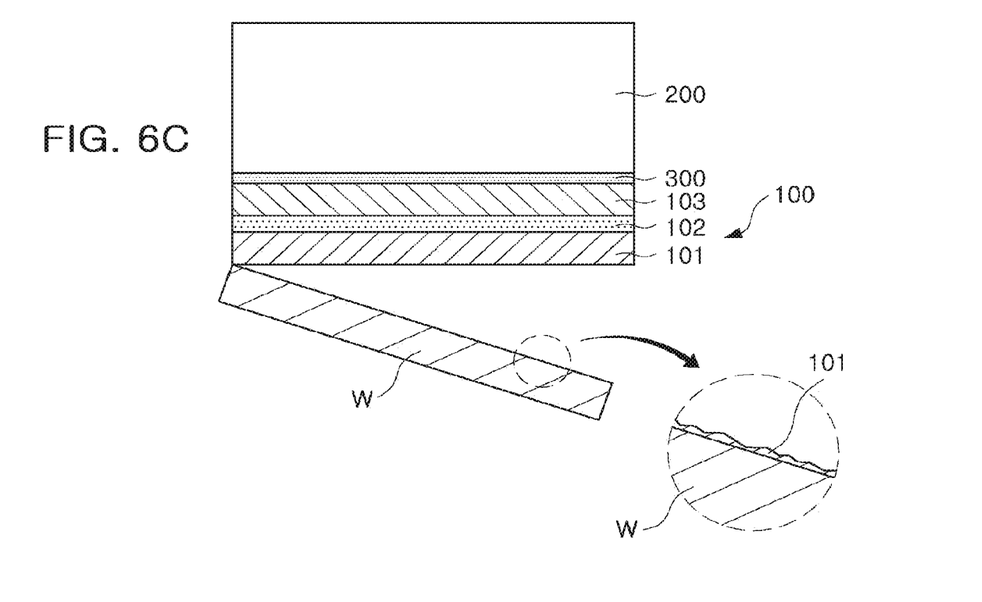
Figure 7:
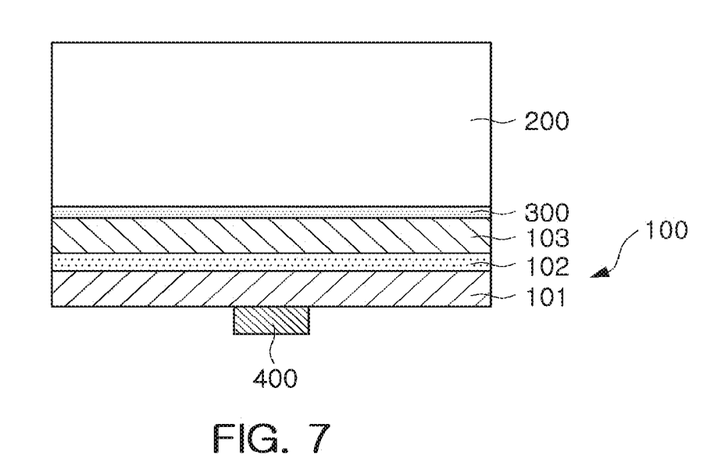
FIG. 7 is a view schematically showing a semiconductor light emitting device manufactured by the method of manufacturing a semiconductor light emitting device of FIG. 6.

FIGS. 6A through 6C are views schematically showing a method of manufacturing a semiconductor light emitting device according to an embodiment of the present invention, and FIG. 7 is a view schematically showing a semiconductor light emitting device manufactured by the method of manufacturing a semiconductor light emitting device of FIG. 6.

First, as shown in FIG. 6A, a first conductivity type semiconductor layer 101, an active layer 102, and a second conductivity type semiconductor layer 103 are sequentially grown on a semiconductor growth substrate, that is, a wafer W, to form a light emitting part 100.

Specifically, the wafer, the semiconductor growth substrate, is seated on the susceptor 20 provided in the reaction chamber 10 of the chemical vapor deposition apparatus 1 or 1' or is loaded into the boat 30 provided in the reaction chamber 10, and the reaction gas G including an MO source is released to perform a deposition process for forming a semiconductor layer.

In the present embodiment, the first and second conductivity type semiconductor layers 101 and 103 may be p-type and n-type semiconductor layers and may be formed of a nitride semiconductor. Therefore, in the present embodiment, it may be understood that the first and second conductivity type semiconductor layers are p-type and n-type semiconductor layers, respectively, but the invention is not limited thereto. The first and second conductivity type semiconductor layers 101 and 103 may have a compositional formula: $Al_xIn_yGa_{(1-x-y)}N$ (where $0 \leq x \leq 1$, $0 \leq y \leq 1$, and $0 \leq x+y \leq 1$). Examples of materials having the above-mentioned compositional formula include GaN, AlGaN, InGaN, AlInGaN, and the like. The active layer 102 formed between the first and second conductivity type semiconductor layers 101 and 103 may emit light having a predetermined level of energy by the recombination of electrons and holes and have a multiple quantum-well (MQW) structure in which quantum well and quantum barrier layers are alternately laminated, for example, an InGaN/GaN structure.

As shown in FIG. 6B, a support part 200 is formed on the second conductivity type semiconductor layer 103 so as to be combined with the light emitting part 100.

The support part 200 may serve as a support body supporting the light emitting part 100 in a laser lift-off process or the like for separating the wafer W from the light emitting part 100 and may be formed of any one selected from the group consisting of Au, Ni, Al, Cu, W, Si, Se, and GaAs, for example, a conductive material having Al doped on a Si substrate. In the present embodiment, the support part 200 may be bonded to the light emitting part 100 via a conductive adhesive layer 300. The conductive adhesive layer 300 may be formed of a eutectic metal material such as AuSn.

Then, as shown in FIG. 6C, the wafer W, the semiconductor growth substrate, is separated from the light emitting part 100. The wafer W may be separated from the first conductivity type semiconductor layer 101 of the light emitting part 100 through the laser lift-off process.

As shown in FIG. 7, an electrode 400 is formed on the first conductivity type semiconductor layer 101 separated from the wafer W to manufacture a vertical type semiconductor light emitting device. The manufactured semiconductor light emitting device is used in a subsequent process for manufacturing a light emitting device package, such as a packaging process.

The first conductivity type semiconductor layer 101 partially remains on a surface of the wafer W, the semiconductor growth substrate separated from the light emitting part 100. Therefore, in the case of manufacturing the semiconductor light emitting device, portions of the first conductivity type semiconductor layer 101 remaining on the surface of the wafer W need to be removed.

To this end, an etching gas is applied to the wafer W to remove a residue of the first conductivity type semiconductor layer 101 from the surface of the separated wafer W.

Hereinafter, a method of removing the residue of the first conductivity type semiconductor layer 101 from the surface of the semiconductor growth substrate will be described with reference to FIGS. 8 through 9B and the chemical vapor deposition apparatus shown in FIG. 1 through FIG. 5.

Figure 8:
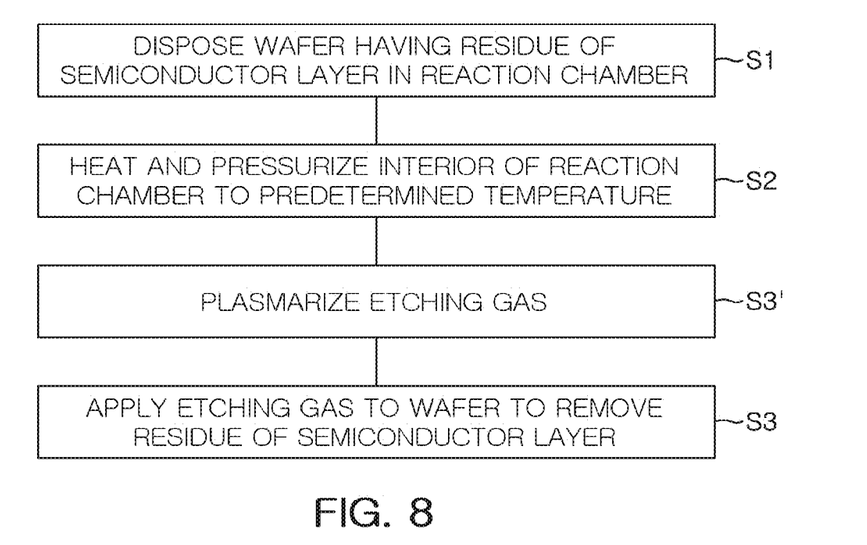
FIG. 8 is a flowchart schematically showing a method of removing a residue of a semiconductor layer from a surface of a wafer that have been separated from the semiconductor layer of FIG. 6C.

FIG. 8 is a flowchart schematically showing a method of removing a residue of a semiconductor layer according to an exemplary embodiment of the present invention.

As shown in FIG. 8, a method of removing a residue of a semiconductor layer according to the embodiment of the present invention may include disposing a plurality of wafers having portions of semiconductor layers remaining on surfaces thereof in a reaction chamber (S1), heating and pressurizing an interior of the reaction chamber so that the plurality of wafers are exposed to predetermined temperature and pressure conditions (S2), and releasing an etching gas into the reaction chamber through a gas supply part to remove the portions of the semiconductor layers remaining on the plurality of wafers (S3). In addition, the removing of the residue of the semiconductor layer remaining on the wafer may further include plasmarizing the etching gas (S3').

Figure 9A:
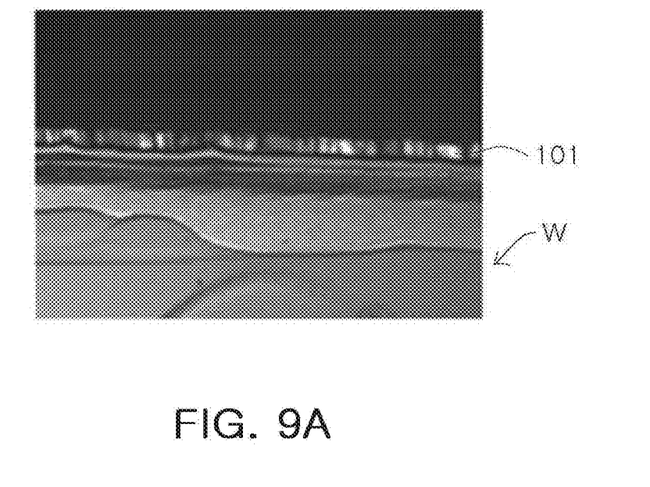
FIG. 9A is an image showing a state in which a residue of the semiconductor layer remains on a surface of a growth substrate.

First, as shown in FIG. 9A, the plurality of wafers W separated from the light emitting part 100 and having residues of the first conductivity type semiconductor layer 101 remaining on surfaces thereof are disposed in the reaction chamber 10 (S1). The wafer W that becomes a recycle object by the removal of the semiconductor layer 101 is not limited to the case in which after the semiconductor layer 101 is separated from the wafer W, the semiconductor layer 101 partially remains, but may also include a case in which the light emitting part 100 formed by a deposition process may not be used due to a defect, such that the wafer W needs to be reused.

The wafer W may be formed of any one selected from the group consisting of sapphire, silicon carbide (SiC), silicon (Si), zinc oxide (ZnO), gallium arsenide (GaAs), and gallium phosphide (GaP). According to the present embodiment, the wafer W formed of sapphire will be described.

In addition, the semiconductor layer 101 may include a nitride-based semiconductor layer formed of a material such as GaN, AlGaN, InGaN, AlInGaN, or the like, as described above.

The reaction chamber 10 may be the single chemical vapor deposition apparatus 1 including the susceptor 20 provided therein, as shown in FIGS. 1 and 2, and the susceptor 20 may include several wafers W seated on an upper surface thereof. Alternatively, the reaction chamber 10 may be the furnace chemical vapor deposition apparatus 1' including the boat 30 provided therein, as shown in FIG. 3, and the boat 30 may include hundreds of wafers W loaded at predetermined intervals in the height direction thereof.

Next, the interior of the reaction chamber 10 is heated and pressurized so that the wafers W are exposed to the predetermined temperature and pressure conditions (S2).

These temperature and pressure conditions may be appropriately controlled within a range in which the semiconductor layer 101 may be etched by the etching gas g to be described below, in consideration of a size, or the like, of the reaction chamber 10. The temperature may be controlled to be within a range of 50° C. to 2000° C., and the pressure may be controlled to be within a range of $10^{-9}$ torr to 1000 torr.

Then, the etching gas g is released into the reaction chamber 10 through the gas supply part 40 to remove a residue of the semiconductor layer 101 remaining on the wafer W (S3).

The gas supply part 40 may have a shower head structure provided on an upper surface of the reaction chamber 10, that is, the chamber cover 12 to release the etching gas g in a downward direction toward the upper surface of the susceptor 20, as shown in FIG. 1.

Alternatively, the gas supply part 40 may have a reservoir structure provided along a circumference of a side of the reaction chamber 10 to inverse-radially release the etching gas g from an edge of an outer peripheral surface of the susceptor 20 toward a center thereof, as shown in FIG. 2.

Alternatively, the gas supply part 40 may be vertically extended in a height direction in which the wafers W are loaded between the internal chamber 13 and the boat 30, as shown in FIG. 3. Further, the gas supply part 40 may release the etching gas g into the reaction chamber 10 through a plurality of release nozzles 41 opened toward the wafer W. The release nozzles 41 may be provided at intervals corresponding to positions at which the wafers W are loaded, so as to release the etching gas g onto surfaces of the respective wafers W. In this case, the release nozzles 41 may be arranged to face the sides of the loaded wafers W or to be positioned between the loaded wafers W.

The etching gas g used for removing the semiconductor layer 101 may be an HCl gas or a $Cl_2$ gas. A mechanism removing the semiconductor layer 101 through the etching gas g will be described. The etching gas g released into the reaction chamber 10 may generate Cl ions under the above-described temperature and pressure conditions in the reaction chamber 10. These Cl ions may decompose GaN into $GaCl_3$ and compounds thereof, and $NH_3$, volatile materials at high temperatures. As a result, GaN is decomposed to be discharged in a gaseous form, such that only the wafer W, stable for HCl and $Cl_2$ gases, remains.

HCl gas or $Cl_2$ gas may be supplied alone as the etching gas g. In some cases, the etching gas may be additionally mixed with an auxiliary gas to control an etching rate, a flow velocity of the etching gas, or the like, according to a size, or the like, of the reaction chamber 10. Examples of the auxiliary gas may include $H_2$ gas, $N_2$ gas, Ar gas, and the like.

The etching gas g released through the gas supply part 40 may be plasmarized and then released (S3'). As shown in FIGS. 1 and 2, the reaction chamber 10 may be provided with a plasma apparatus 50, allowing the released etching gas g to be plasmarized to increase ionization density in the reaction chamber 10, whereby the etching rate may be controlled, for example, accelerated.

Meanwhile, with respect to the wafer 100 from which the semiconductor layer 101 is removed by the released etching gas g, whether or not a residue remains on the surface of the wafer and whether or not a thickness of the wafer W is decreased, a magnitude of the decreased thickness, and the like, may be inspected.

The tests may be automatically performed through a sensor (not shown) provided in the reaction chamber 10. In the case in which the residue is found, the temperature and pressure conditions in the reaction chamber 10 are controlled, such that the residue may be removed or an etching process may additionally be performed.

Then, the wafer W of which the recycling thereof has been completed by removing the residue of the semiconductor layer 101 by the etching gas g is withdrawn from the reaction chamber 10. In addition, the etching gas g is stably exhausted to the outside through an exhaust part 70 connected to the reaction chamber 10.

Figure 9B:
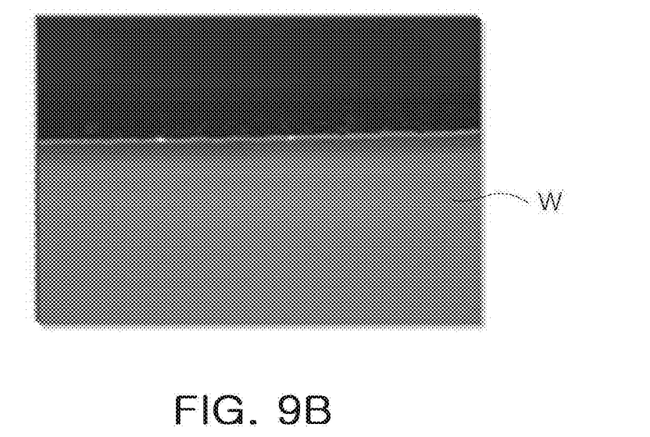
FIG. 9B is an image showing a state in which the residue of the semiconductor layer of FIG. 9A is removed.

FIG. 9A is an image showing a state in which the residue of the semiconductor layer 101 remains on the surface of the wafer W separated from the light emitting part 100; and FIG. 9B is an image showing a state in which the residue of the semiconductor layer 101 has been removed by the above-described method. It could be appreciated that the residue of the semiconductor layer 101 remaining on the surface of the wafer as shown in FIG. 9A has been removed from the surface of the wafer W by the etching gas as shown in FIG. 9B.

As described above, in order to re-manufacture a semiconductor light emitting device using the semiconductor growth substrate separated from the light emitting part, the portions of the semiconductor layer remaining on the surface of the semiconductor growth substrate W need to be removed. To this end, the semiconductor growth substrate W is seated on the susceptor 20 provided in the reaction chamber 10 of the chemical vapor deposition apparatus or loaded into the boat 30 provided in the reaction chamber 10, by the same method as a deposition process of the semiconductor layer and the etching gas g is then released thereonto to remove the residue remaining on the surface of the semiconductor growth substrate than becomes a recycled object, whereby the used substrate may be recycled.

Therefore, the chemical vapor deposition apparatus 1 or 1' for manufacturing the semiconductor light emitting device may be used as it is for recycling the wafer, without preparing a separate recycle device according to a scheme of recycling the wafer by polishing the surface of the wafer separated from the semiconductor layer in the related art.

As described above, in the method of manufacturing a semiconductor light emitting device according to the embodiment of the present invention, the chemical vapor deposition apparatus used for depositing the semiconductor layer on the wafer may be re-used as a recycle device for recycling the wafer without a separate apparatus or facility for physical processing or chemical immersion.

Further, a recycling process may be easily performed by using the etching gas for the etching process, instead of the reaction gas for the deposition process, in the substantially same manner as the semiconductor layer thin film deposition process through the chemical vapor deposition apparatus.

In addition, the residue of the semiconductor layer may be removed through the etching gas, whereby damage to the surface of the wafer may be significantly reduced.

As set forth above, in a method of manufacturing a semiconductor light emitting device according to embodiments of the present invention, a residue of a semiconductor layer remaining on a surface of a wafer separated from the semiconductor layer is removed without physical processing, whereby damage to the surface of the wafer may be significantly reduced.

In addition, a plurality of wafers are simultaneously processed, whereby productivity may be improved.

While the present invention has been shown and described in connection with the embodiments, it will be apparent to those skilled in the art that modifications and variations can be made without departing from the spirit and scope of the invention as defined by the appended claims.

What is claimed is:

1. A method of manufacturing a semiconductor light emitting device, the method comprising:
   sequentially growing a first conductivity type semiconductor layer, an active layer, and a second conductivity type semiconductor layer on a semiconductor growth substrate to form a light emitting part;
   forming a support part on a first side of the second conductivity type semiconductor layer by bonding the support part to the first side via a conductive adhesive layer, to couple the support part to the light emitting part, the first side being opposite a second side of the second conductivity type semiconductor layer which contacts the active layer;
   separating the semiconductor growth substrate from the light emitting part by using the support part; and
   applying an etching gas to the semiconductor growth substrate to remove a residue of the first conductivity type semiconductor layer from a surface of the semiconductor growth substrate,
   wherein the applying of the etching gas comprises:
   disposing a boat comprising a plurality of semiconductor growth substrates loaded in a height direction therein, each of the plurality of semiconductor growth substrates having the residue of the first conductivity type semiconductor layer remaining on the respective surfaces thereon, in a reaction chamber;
   heating and pressurizing an interior of the reaction chamber so that the plurality of semiconductor growth substrates is exposed to predetermined temperature and pressure conditions; and
   releasing the etching gas into the reaction chamber through a plurality of gas supply parts to remove the residue of the first conductivity type semiconductor layer from the respective surfaces of the plurality of semiconductor growth substrates,
   wherein the plurality of gas supply parts are disposed to be spaced apart from each other along a circumference of the boat, the plurality of gas supply parts having different heights corresponding to heights of respective regions of the interior of the reaction chamber partitioned in the height direction, and
   wherein the releasing of the etching gas comprises releasing the etching gas into the respective regions partitioned in the height direction in the interior of the reaction chamber through the plurality of gas supply parts having the different heights.

2. The method of claim 1, further comprising inspecting whether or not the residue remains on the surface of one of the plurality of semiconductor growth substrates and whether or not a thickness of the one of the plurality of semiconductor growth substrates is decreased, after the applying of the etching gas.

3. The method of claim 1, wherein the first and second conductivity type semiconductor layers comprise a nitride-based semiconductor layer.

4. The method of claim 3, wherein the nitride-based semiconductor layer comprises GaN, AlGaN, InGaN, or AlInGaN.

5. The method of claim 1, wherein the support part is formed of a conductive material.

6. The method of claim 1, wherein the etching gas comprises an HCl gas or a $Cl_2$ gas.

7. The method of claim 1, wherein the etching gas is further mixed with an auxiliary gas.

8. The method of claim 7, wherein the auxiliary gas comprises a hydrogen ($H_2$) gas, a nitrogen ($N_2$) gas, or an argon (Ar) gas.

9. The method of claim 1, further comprising:
   plasmarizing the etching gas; and
   releasing the plasmarized gas.

10. The method of claim 1, wherein one of the plurality of gas supply parts is provided on an upper surface of the reaction chamber and releases the etching gas toward one of the plurality of semiconductor growth substrates provided thereunder.

11. The method of claim 1, wherein one of the plurality of gas supply parts is provided along a circumference of a side of the reaction chamber and inverse-radially releases the etching gas toward a central part of the reaction chamber.

12. The method of claim 1, wherein the reaction chamber is configured to have a single chemical vapor deposition apparatus, and has one of the plurality of semiconductor growth substrates seated on an upper surface of a susceptor provided therein.

13. The method of claim 1, wherein the reaction chamber is configured to have a furnace chemical vapor deposition apparatus, and has one of the plurality of semiconductor growth substrates loaded in the boat provided therein.

14. The method of claim 1, wherein the conductive adhesive layer comprises a eutectic metal material.

* * * * *